United States Patent
Lou

(10) Patent No.: US 11,494,036 B2
(45) Date of Patent: Nov. 8, 2022

(54) PRESS SENSING ASSEMBLY AND TERMINAL DEVICE

(71) Applicant: BEIJING XIAOMI MOBILE SOFTWARE CO., LTD., Beijing (CN)

(72) Inventor: Chunjie Lou, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/329,412

(22) Filed: May 25, 2021

(65) Prior Publication Data

US 2022/0129111 A1      Apr. 28, 2022

(30) Foreign Application Priority Data

Oct. 28, 2020   (CN) .......................... 202011176148.2

(51) Int. Cl.
*G06F 3/043*       (2006.01)
*B06B 1/06*        (2006.01)

(52) U.S. Cl.
CPC .......... *G06F 3/0436* (2013.01); *B06B 1/0622* (2013.01)

(58) Field of Classification Search
CPC ... G06F 3/0436; B06B 1/0622; H03K 17/964; H03K 2217/96007
See application file for complete search history.

(56) References Cited

U.S. PATENT DOCUMENTS

| | | | |
|---|---|---|---|
| 2018/0267636 A1* | 9/2018 | Chiu | G06F 1/1643 |
| 2018/0341359 A1* | 11/2018 | Khajeh | G06F 1/1656 |
| 2019/0073078 A1* | 3/2019 | Sheng | G06F 3/04164 |
| 2019/0325187 A1* | 10/2019 | Liu | H05K 1/189 |

OTHER PUBLICATIONS

European Patent Application No. 21176210.9 extended Search and Opinion dated Nov. 19, 2021, 9 pages.

* cited by examiner

*Primary Examiner* — Amit Chatly
(74) *Attorney, Agent, or Firm* — Lathrop GPM LLP

(57) ABSTRACT

The present disclosure relates to a press sensing assembly and a terminal device. The press sensing assembly includes: an emitting element including a first side and a second side thereopposite and emitting an ultrasonic wave; a receiving element disposed adjacent to the emitting element, receiving a reflected wave of the reflected ultrasonic wave; and a reflecting pad disposed the first side and the receiving element, and a first surface of the reflecting pad abutting the emitting element and the receiving element, wherein when the second side and/or the receiving element are/is pressed, a region of the reflecting pad corresponding to the pressed region deforms, and a medium density in a deforming region increases.

20 Claims, 6 Drawing Sheets emitting an ultrasonic wave through an emitting element, and receiving a reflected wave through a receiving element — S31 generating a corresponding press instruction if intensity of the reflected wave exceeds a threshold — S32

PRESS SENSING ASSEMBLY AND TERMINAL DEVICE

CROSS-REFERENCE TO RELATED APPLICATION

This application claims priority to and benefits of Chinese Patent Application Serial No. 202011176148.2, filed on Oct. 28, 2020, the entire content of which is incorporated herein by reference.

TECHNICAL FIELD

The present disclosure relates to a technical field of terminal control, and more particularly to a press sensing assembly and a terminal device.

BACKGROUND

At present, in some terminal devices such as mobile phones and tablet computers, touch screens are generally used for control, and mechanical keys such as a lock screen key and a volume adjustment key are arranged on a side edge of the terminal device, i.e. an outer sidewall perpendicular to the touch screen. In some scenarios, for example, when some games are being played, horizontal screen display and operation to the terminal device are needed. Due to enough maneuverability of some games, in addition to an operation in a lower thumb region, there are other operations to meet complex instructions. Current terminal devices cannot realize complex operation functions, or the outer sidewall is provided with keys, such that the operation is inconvenient and not reliable, which cannot meet user's requirement, thereby leading to poor user experience.

SUMMARY

To overcome the problems existing in a related art, the present disclosure provides a press sensing assembly and a terminal device.

According to a first aspect of embodiments of the present disclosure, a press sensing assembly is provided, including: an emitting element including a first side and a second side thereopposite and emitting an ultrasonic wave; a receiving element disposed adjacent to the emitting element, receiving a reflected wave of the reflected ultrasonic wave; and a reflecting pad disposed on the first side and the receiving element, and a first surface of the reflecting pad abutting the emitting element and the receiving element, wherein when the second side and/or the receiving element are/is pressed, a region of the reflecting pad corresponding to the pressed region deforms, and medium density in the deforming region increases.

According to a second aspect of the embodiments of the present disclosure, a terminal device is provided, including: a display screen; and the press sensing assembly. The press sensing assembly includes: an emitting element including a first side and a second side thereopposite and emitting an ultrasonic wave; a receiving element disposed adjacent to the emitting element, receiving a reflected wave of the reflected ultrasonic wave; and a reflecting pad disposed on the first side and the receiving element, and a first surface of the reflecting pad abutting the emitting element and the receiving element, wherein when the second side and/or the receiving element are/is pressed, a region of the reflecting pad corresponding to the pressed region deforms, and medium density in the deforming region increases.

The technical solutions provided in the embodiments of the present disclosure may include the following beneficial effects: the reflecting pad, with a changed medium density during deformation, abuts the emitting element and the receiving element, the emitting element emits an ultrasonic wave to one side of the reflecting pad, and the receiving element receives a reflected wave, such that a press instruction may be generated according to an intensity change of the reflected wave in case of a user press, enabling the instruction to be more reliable and avoiding the phenomenon of accidental contact.

It may be understood that the above general description and the following detailed description are merely exemplary and explanatory, and are not construed to limit the present disclosure.

BRIEF DESCRIPTION OF THE DRAWINGS

The drawings herein are incorporated in and constitute a part of the specification, showing the embodiments of the present disclosure and, together with the specification, utilized to explain the principles of the present disclosure.

FIG. 4 is pressed according to an exemplary embodiment of the present disclosure.

DETAILED DESCRIPTION

Exemplary embodiments of the present disclosure will be described in detail herein, and the examples thereof are illustrated in the accompanying drawings. When the description below concerns the drawings, same numbers in different drawings represent same or similar elements unless indicated otherwise. In the following exemplary embodiments, the embodiments illustrated do not represent all embodiments consistent with the present disclosure. Instead, they are merely examples of devices and methods consistent with some aspects of the present disclosure as detailed in the appended claims.

Currently, in some related art, a side face of a terminal device is provided with mechanical keys. Corresponding instructions are generated by pressing the keys, to complete corresponding operations. However, in order to facilitate the operations, the mechanical keys need to protrude beyond a sidewall plane, affecting the aesthetics. Moreover, many terminal devices are provided with lock screen keys and volume keys, and the addition of the mechanical keys easily causes confusion.

In some other related art, a display screen of the terminal device adopts a curved screen, which extends to a side wall. A user instruction is determined through touch sensing of the touch screen. However, the touch sensing is based on contact, which is too sensitive and easily causes accidental touch.

Figure 1:
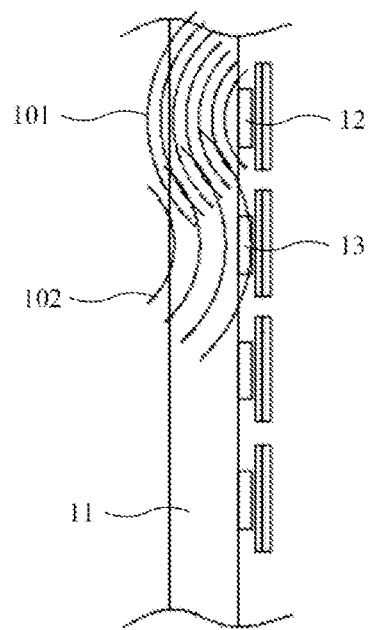
FIG. 1 is a schematic view of a sensing assembly.
Figure 2:
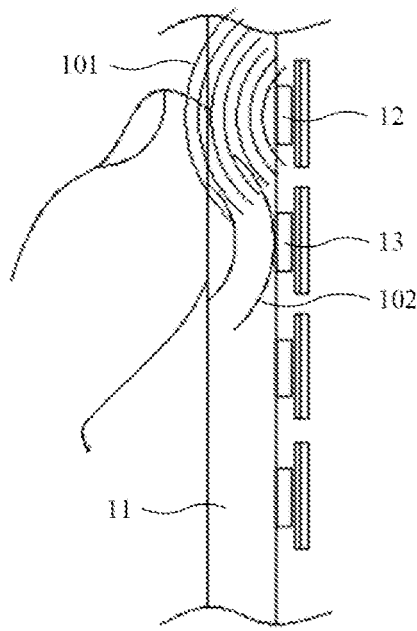
FIG. 2 is a schematic view of a state in which a sensing assembly is touched.

FIG. 1 and FIG. 2 illustrate, an inner side of a middle frame 11 on a side face of the terminal device is provided with an ultrasonic sensing element, including an emitting element (Transmit, TX) 12 and a receiving element (Receive, RX) 13. Through positive and negative effects of piezoelectric ceramics, mutual conversion of kinetic energy and electrical signals is realized to implement a side key sensing function. Both the emitting element 12 and the receiving element 13 are a generator and a receiver made of piezoelectric ceramic materials. A current drives the emitting element 12 to produce an ultrasonic wave, electrical energy is converted into kinetic energy, and an ultrasonic wave 101 is sent outward. When receiving a reflected wave 102 of the ultrasonic wave, the receiving element 13 converts vibration into an electrical signal through the vibration of piezoelectric ceramics. According to the principle of ultrasonic waves, intensity of an ultrasonic wave may gradually decay during transmission, and when encountering substances with different medium densities, the ultrasonic wave may be reflected, so as to form a reflected wave. Moreover, greater a medium density difference, the more the reflection, and the greater the intensity of the reflected wave.

Based on this, when there is no finger and no touch, as illustrated in FIG. 1, the ultrasonic wave 101 emitted by the emitting element 12 sequentially passes through the middle frame 11 and outside air. Medium density of the air is different from that of the middle frame 11, so the ultrasonic wave 101 is reflected to form the reflected wave 102, and a reflection quantity at this time is defined as M. When a finger touches, as illustrated in FIG. 2, the ultrasonic wave 101 sequentially passes through the middle frame 11 and the finger. Since medium density of the finger is different from that of the middle frame 11, a reflection quantity of the reflected wave 102 of the reflected ultrasonic wave at this time is N. Since medium density difference between the finger and the middle frame 11 is less than that between the air and the middle frame 11, the reflection quantity M is greater than the reflection quantity N. Finger touch is determined by detecting a difference between the reflection quantities of the ultrasonic wave before and after the finger touch, i.e., $\delta=M-N$.

The density of the air is between 1 kg/m$^3$ and 2 kg/m$^3$ or approximately 1.3 kg/m$^3$, and the density of the finger is approximately 1000 kg/m$^3$. In order to ensure an obvious difference, the middle frame 11 needs to be made of metal, and its thickness cannot exceed 1.6 mm to ensure the transmission of the ultrasonic wave.

In the above manners, similar to the previous technology, the finger touch would trigger a key, which is prone to accidental touch, and the middle frame 11 needs to be made of a metal material, with a thickness not exceeding 1.6 mm.

Figure 3:
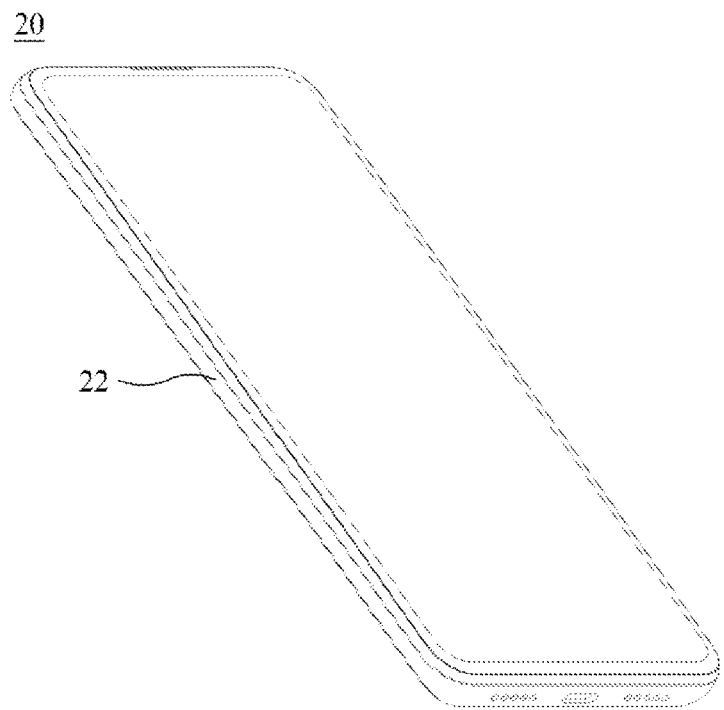
FIG. 3 is a schematic view of a terminal device according to an exemplary embodiment of the present disclosure.
Figure 4:
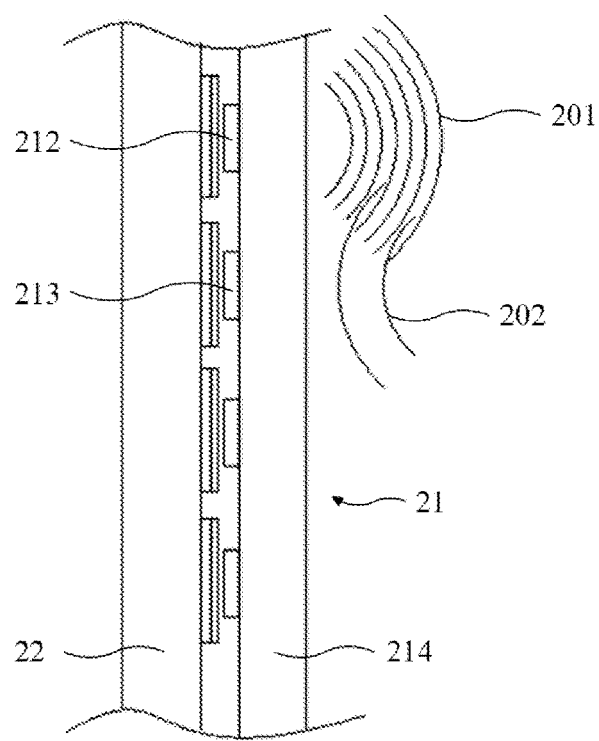
FIG. 4 is a schematic view of a press-sensing assembly according to an exemplary embodiment of the present disclosure.
Figure 5:
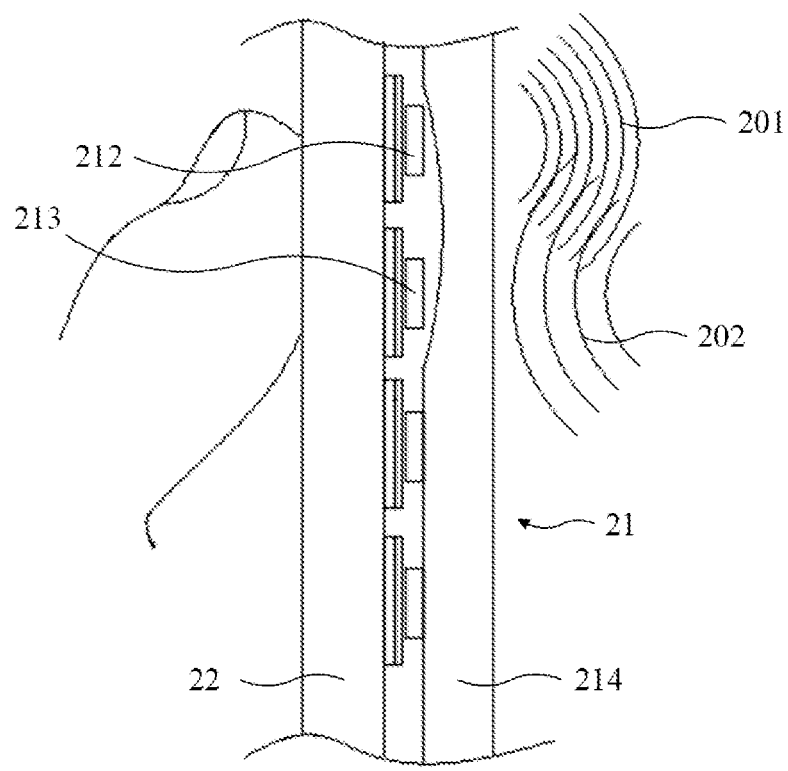
FIG. 5 is a schematic view of a state in which the press sensing assembly

In order to solve the above technical problems, as illustrated in FIG. 3, FIG. 4, and FIG. 5, the present disclosure provides a press sensing assembly 21, which is applicable to a terminal device 20 such as a mobile phone, adopts an ultrasonic technology, and needs to sense by pressing, instead of by touch, to generate an instruction to complete operations, thereby avoiding accidental touch. Moreover, the middle frame 22 may be made of different materials, have different thicknesses, so as to meet requirements of different terminal devices.

As illustrated in FIG. 4 and FIG. 5, the press sensing assembly 21 may include: an emitting element 212, a receiving element 213, and a reflecting pad 214.

The emitting element 212 emits an ultrasonic wave 201.

The receiving element 213 is disposed adjacent to the emitting element 212, receiving a reflected wave 202 of the reflected ultrasonic wave 201. The receiving element 213 and the emitting element 212 may be disposed side by side and at a close distance, such that the reflected wave 202 of the reflected ultrasonic wave 201 emitted by the emitting element 212 may be more accurately received. The reflected wave 202 in the present disclosure is also an ultrasonic wave and is referred to as reflected wave 202 for convenience only.

The reflecting pad 214 is disposed on one side of the emitting element 212 and the receiving element 213, and a first surface of the reflecting pad 214 abuts the emitting element 212 and the receiving element 213. When the other side of the emitting element 212 and the receiving element 213 is pressed, a region of the reflecting pad 214 corresponding to the pressed region deforms, and medium density in the deforming region increases.

In the embodiments of the present disclosure, one side of the emitting element 212 and the receiving element 213 is provided with the reflecting pad 214. The reflecting pad 214 may exceed a region provided with the emitting element 212 and the receiving element 213; or may be disposed corresponding to the emitting element 212 and the receiving element 213, and that is, the reflecting pad 214 is disposed, according to a range of the pressed region, only in the region provided with the emitting element 212 and the receiving element 213. A first surface of the reflecting pad 214 abuts the emitting element 212 and the receiving element 213, such that the ultrasonic wave 201 emitted by the emitting element 212 may directly enter the reflecting pad 214, avoiding signal interference and loss of ultrasonic intensity due to the reflection caused by the ultrasonic wave 201 passing through air or other media and then entering the reflecting pad 214 after the ultrasonic wave 201 is emitted from the emitting element 212. Similarly, this also avoids the loss in a path where the ultrasonic wave 201 is reflected by a medium on a back side of the reflecting pad 214 and is transferred to the receiving element 213. More importantly, the emitting element 212 and the receiving element 213 need to be pushed inward when the other side of the emitting element 212 and the receiving element 213 is pressed, such that the reflecting pad 214 in the region deforms. Therefore, a corresponding deformation may be generated accurately and reliably upon pressing only when the reflecting pad 214 abuts the emitting element 212 and the receiving element 213 all the time, so as to avoid an error caused by a gap.

The emitting element 212 and the receiving element 213 may be mounted in a region that needs to be pressed, that is, a position that needs to be pressed and controlled through the press sensing assembly 21. For example, they may be disposed on an inner side of the middle frame 22 of the terminal device 20, or on an inner side face of a component of another device needing to be pressed. The component is pressed inward, such that the emitting element 212 and the receiving element 213 are pushed inward, causing the reflecting pad 214 in the region to deform.

In some cases, the emitting element 212 and the receiving element 213 may be disposed adjacent to each other; or two sides of one emitting element 212 each are provided with one receiving element 213, or two sides of one receiving element 213 each are provided with one emitting element 212; or a plurality of emitting elements 212 and a plurality of receiving elements 213 are provided, and the emitting elements 212 and the receiving elements 213 are arranged alternately in a row or in a matrix array. The number and the arrangement manner may be determined according to a position and an area of a region needing to be pressed. The emitting element 212 and the receiving element 213 are distributed on an inner side of the region needing to be pressed, such that a corresponding signal may be acquired accurately and reliably when the region is pressed.

Figure 6:
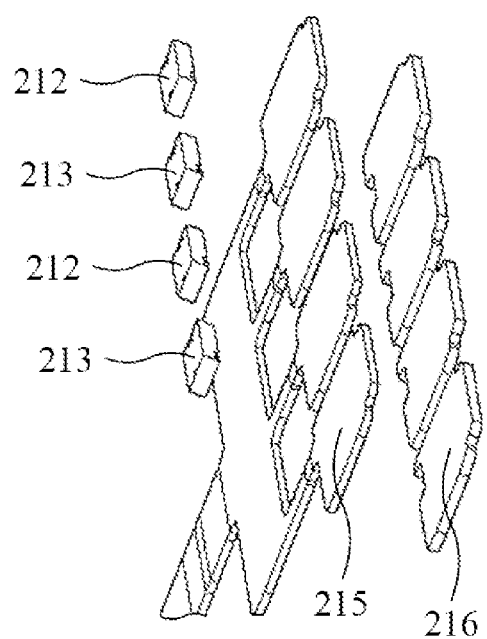
FIG. 6 is a schematic exploded view of an emitting element and a receiving element according to an exemplary embodiment of the present disclosure.
Figure 7:
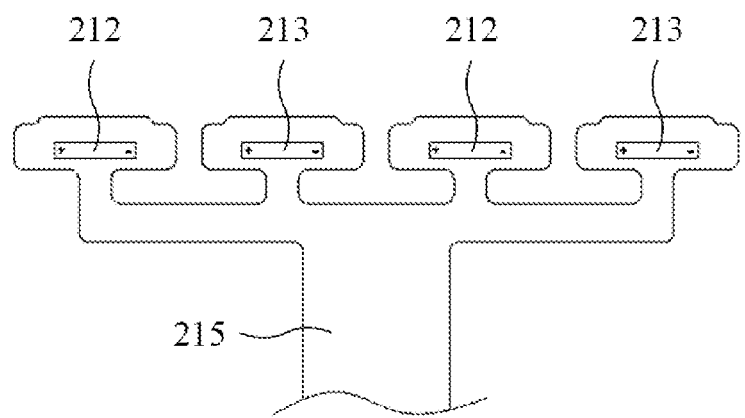
FIG. 7 is a schematic view of an emitting element and a receiving element according to an exemplary embodiment of the present disclosure.

The emitting element 212 and the receiving element 213 may be an emitter and a receiver made of piezoelectric ceramic materials. Current signal is introduced into the emitting element 212 to convert the electrical energy into kinetic energy, and generate an ultrasonic wave. The receiving element 213 receives the ultrasonic wave and converts the kinetic energy into an electrical signal through the vibration of piezoelectric ceramics. As illustrated in FIG. 6 and FIG. 7, the emitting element 212 and the receiving element 213 may be respectively affixed to a Flexible Printed Circuit (FPC) 215 through a Surface Mounted Technology (SMT), and on a back side, may be supported by a base layer 216 made of such as a resin material. During assembly, one side of a back face of the emitting element 212 and the receiving element 213 is glued, by dispensing, to the middle frame 22 of the terminal device 20 or to an inner side face of a pressed component of another device. The inner side may abut against the emitting element 212 and the receiving element 213 through the reflecting pad 214.

In the embodiments of the present disclosure, a user may press a corresponding position to cause the emitting element 212 and the receiving element 213 to push the reflecting pad 214 inward, such that the reflecting pad 214 deforms, thereby changing the medium density (material density) of the reflecting pad 214. Since a medium of the reflecting pad 214 is different from that on the inner side of the reflecting pad 214 (the density of a gas between pad 214 and middle frame 22 for example), a density difference between the medium of the reflecting pad 214 and the medium on the inner side of the reflecting pad 214 changes correspondingly when the reflecting pad 214 changes the density of the medium, such that intensity of the reflected wave 202 generated by the density difference is changed after the ultrasonic wave 201 emitted inward from the emitting element 212 passes through the reflecting pad 214. After receiving the reflected wave 202, the receiving element 213 may determine, according to the intensity of the reflected wave 202, whether press occurs. For example, a threshold may be preset. When the intensity of the reflected wave 202 received by the receiving element 213 exceeds or equals the threshold, the terminal device 20 may determine that the middle frame 22 is pressed and then generate a corresponding press instruction. The intensity of the reflected wave 202 exceeding the threshold may be the intensity being either below or above the threshold, which depends on the density of the medium on the inner side of the reflecting pad 214, that is, whether the density difference between the medium of the reflecting pad 214 and the medium on the inner side of the reflecting pad 214 increases or decreases before and after the reflecting pad 214 is extruded to deform. If the density difference between the medium of the reflecting pad 214 in a deformation state and the medium on the inner side of the reflecting pad 214 increases, according to the principle of reflected waves, the intensity of the reflected wave 202 increases when the reflecting pad 214 is pressed, and the threshold may be preset to be greater than the intensity of the reflected wave 202 when it is not pressed. When the intensity of the reflected wave 202 is detected to be greater than or equal to the threshold, the terminal device 20 determines that it is pressed. On the other hand, if the density difference between the medium of the reflecting pad 214 in a deformation state and the medium on the inner side of the reflecting pad 214 decreases, according to the principle of reflected waves, the intensity of the reflected wave 202 decreases when the reflecting pad 214 is pressed, and the threshold may be preset to be less than the intensity of the reflected wave 202 when it is not pressed. When the intensity of the reflected wave 202 is detected to be less than or equal to the threshold, the terminal device 20 determines that it is pressed.

The embodiments of the present disclosure adopt the reflection principle of ultrasonic waves, which is, in the process of transmission, a reflection quantity of an ultrasonic wave is positively correlated with a density difference between media. According to the reflection principle of ultrasonic waves, when an ultrasonic wave is transmitted between media, the ultrasonic wave may be reflected, and a reflection quantity is positively correlated with a density difference between the media. The density difference refers to an absolute value of data of the subtraction of the densities of the two media herein. That is, the reflection quantity is irrelevant to a relationship between the medium densities of the two media. For example, in the following two cases, the density of the medium first entering is A, and the density of the medium entering later is B; or the density of the medium first entering is B, and the density of the medium entering later is A; density differences in the two cases are equal, i.e., |A−B|.

In the present embodiments, the sensing of the ultrasonic wave and the generation of the instruction require the judgment of whether it is pressed, that is, need to be determined through transformation of the ultrasonic wave before and after pressing. Based on the above principle, the greater the change in the ultrasonic wave before and after pressing, the more accurate the judgment. For example, the reflection intensity of the reflected wave is low before pressing, and high after pressing; or conversely, the intensity of the reflected wave is relatively high before pressing and relatively low after pressing. In order to ensure a detection effect, on the one hand, the reflecting pad 214 may be made of a material with a great change in the medium density before and after the deformation; on the other hand, according to the above reflection principle of ultrasonic waves, a density difference is an absolute value of the subtraction of the densities of two media, and thus a close density difference between the medium of the reflecting pad 214 before and after the deformation and the medium on the inner side of the reflecting pad 214 needs to be avoided.

In one embodiment, the medium density (material density) of the reflecting pad 214 is $\rho$ and satisfies $1 \text{ kg/m}^3 \geq \rho \geq 1.5 \text{ kg/m}^3$. In the present embodiment, the medium density of the reflecting pad 214 is close to the density of the air. In some cases, the medium on the inner side of the reflecting pad 214 may be air, that is, no other components are provided on the inner side of the reflecting pad 214 or at least on an inner side of a region corresponding to the emitting element 212 and the receiving element 213. In this case, due to the close densities, the ultrasonic wave 201 emitted from the emitting element 212 has a small reflection quantity when passing through the reflecting pad 214 and then entering the air. Therefore, the reflected wave 202 received by the receiving element 213 has relatively low intensity. After the reflecting pad 214 is extruded to deform, the density increases and is greater than the density of air, such that the density differences before and after the deformation vary significantly. Therefore, when the ultrasonic wave 201 emitted from the emitting element 212 passes through the reflecting pad 214 to enter the air after being pressed, due to the greater density difference, the reflection quantity may be relatively high, such that the intensity of the reflected wave 202 that may be received by the receiving element 213 is also relatively higher. Whether it is pressed may be determined through a significant change in the intensity of the reflected wave 202 before or after the receiving element 213 receives the reflected wave 202, and reliability and accuracy of the results may be guaranteed.

In some embodiments, the reflecting pad 214 may be made of rubber. In the present embodiment, the reflecting pad 214 is made of flexible rubber, such that the reflector pad 214 is more likely to deform when extruded, thus changing its density to a greater extent. The reflecting pad 214 may also be made of other flexible materials.

Figure 8:
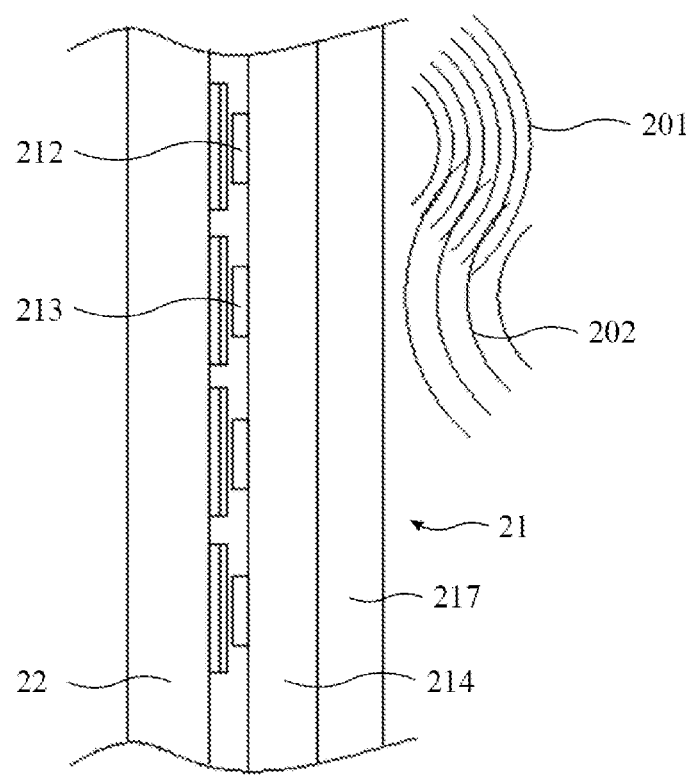
FIG. 8 is a schematic view of another press sensing assembly according to an exemplary embodiment of the present disclosure.
Figure 9:
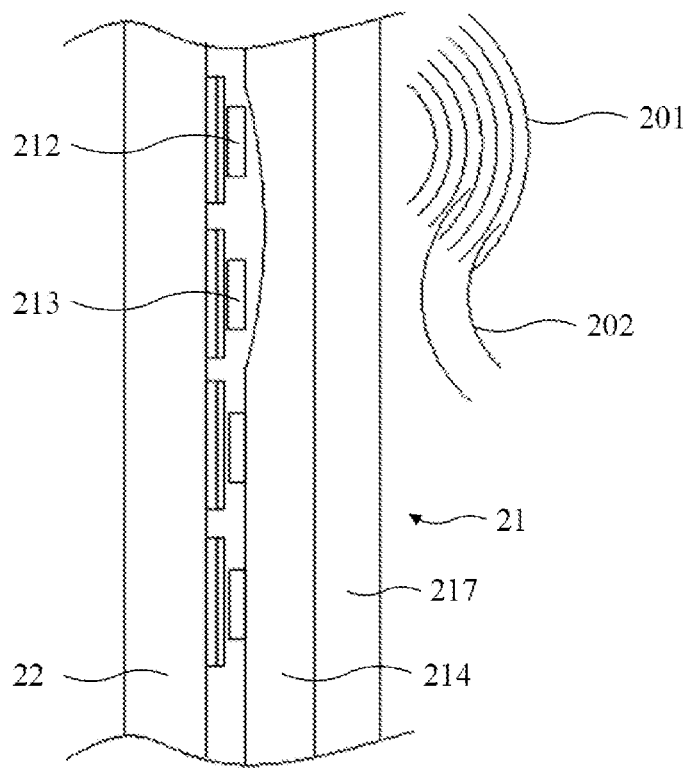
FIG. 9 is a schematic view of another state in which press sensing assembly is pressed according to an exemplary embodiment of the present disclosure.

In some embodiments, as illustrated in FIG. 8 and FIG. 9, the press sensing assembly 21 may further include: a support plate 217. The support plate 217 is disposed on a second surface of the reflecting pad 214, and covers at least a region corresponding to the emitting element 212 and the receiving element 213, a medium density of the support plate 217 is different from that of the reflecting pad 214, and the second surface faces away from the first surface. In the present embodiment, the support plate 217 is disposed on the second surface of the reflecting pad 214, that is, on a surface of the inner side of the reflecting pad 214. The support plate 217 may be made of a relatively rigid material, and may support the reflecting pad 214 on the inner side of the reflecting pad 214. When the first surface of the reflecting pad 214 is pushed by the emitting element 212 and the receiving element 213 to deform, the support plate 217 may support the second surface of the reflecting pad 214, such that an extruded part of the reflecting pad 214 may not displace, which counteracts the pushing force and results in a reduction in the deformation quantity. With the support plate 217, the deformation quantity of the reflecting pad 214 may be guarantee, so as to guarantee the variation of the medium density before and after the reflecting pad 214 is extruded to deform.

Meanwhile, the support plate 217 abuts the second surface of the reflecting pad 214, such that the ultrasonic wave is reflected when passing through the reflecting pad 214 to enter the support plate 217, that is, two media composed of the reflecting pad 214 and the support plate 217 are formed to cause the ultrasonic wave to be reflected. According to the above reflection principle of ultrasonic waves, in some embodiments, the support plate 217 may be made of a metal material, and a medium density may be greater than or equal to 1000 kg/m³. The medium density of the support plate 217 may be generally greater than that of the reflecting pad 214, such that in case of no pressing, a density difference between the reflecting pad 214 and the support plate 217 is relatively greater, and a reflection quantity generated by the ultrasonic wave 201 emitted from the emitting element 212 when the ultrasonic wave 201 passes through the reflecting pad 214 to enter the support plate 217 is relatively greater, and the intensity of the reflected wave 202 that may be received by the receiving element 213 may also be relatively higher. When pressed, the reflecting pad 214 deforms, and the medium density increases, such that the density difference between the reflecting pad 214 and the support plate 217 decreases, and the intensity of the reflected wave 202 may be reduced, so as to determine whether press occurs based on the above.

With the press sensing assembly 21 in any one of the above embodiments, the risk of accidental touch of a controlled key disposed on a surface of the terminal device 20 or other devices may be reduced.

Based on the same conception, the present disclosure further provides a terminal device 20. As illustrated in FIG. 3, the terminal device 20 of the present disclosure may include a display screen, and further includes the press sensing assembly 21 as described in any one of the above embodiments.

The terminal device 20 provided in the present disclosure is provided with the press sensing assembly 21 in any one of the above embodiments, such that control manners may be enriched, especially in some scenarios of landscape operations, the user may conveniently press a corresponding pressing region of the press sensing assembly 21, so as to generate a corresponding instruction and implement a corresponding function. Moreover, in use, finger touch may not generate an instruction in the state of the press sensing assembly 21, and an instruction may be generated only through a certain degree of deformation under a certain amount of pressure, thus reducing the risk of accidental touch.

In some embodiments, as illustrated in FIG. 4 and FIG. 5, the terminal device 20 may include: a middle frame 22. The middle frame 22 may be a frame body for forming an outer side wall of the terminal device 20, which is configured to support some components of the terminal device 20, and also plays roles in sealing and protection.

A back side of the emitting element 212 is disposed on an inner side face of the middle frame 22, for emitting the ultrasonic wave 201. In the embodiments of the present disclosure, the back side of the emitting element 212 is disposed on the middle frame 22, so as to emit the ultrasonic wave 201 toward an inner side of the terminal device 20 and reflect based on inside elements, thereby avoiding the risk of accidental touch easily caused by external touch.

A back side of the receiving element 213 is disposed on an inner side face of the middle frame 22, for receiving the reflected wave 202 of the reflected ultrasonic wave 201.

In some cases, the number and the arrangement manner of the emitting element 212 and the receiving element 213 may be determined according to a position and an area of a pressed region disposed on the middle frame 22. The emitting element 212 and the receiving element 213 are distributed on an inner side of the region needing to be pressed in the middle frame 22, such that a corresponding signal may be acquired accurately and reliably when the region is pressed.

The reflecting pad 214 is disposed on an inner side of the emitting element 212 and the receiving element 213, and a first surface of the reflecting pad 214 abuts the emitting element 212 and the receiving element 213. When an outer side face of the middle frame 22 is pressed, a region of the reflecting pad 214 corresponding to the pressed region deforms, and a medium density in the deforming region increases. In the embodiments of the present disclosure, the reflecting pad 214 is disposed on an inner side of the emitting element 212 and the receiving element 213, and the reflecting pad 214 may be disposed on an entire inner side face of the middle frame 22, or may be disposed corresponding to the emitting element 212 and the receiving element 213, that is, the reflecting pad is disposed, according to a range of the pressed region, only in the region provided with the emitting element 212 and the receiving element 213. A first surface of the reflecting pad 214 is a surface facing one side of the middle frame 22, and abuts the emitting element 212 and the receiving element 213, such that the ultrasonic wave 201 emitted by the emitting element 212 may directly enter the reflecting pad 214, avoiding signal interference and loss of ultrasonic intensity due to the reflection caused by the ultrasonic wave 201 passing through air or other media and then entering the reflecting pad 214 after it is emitted from the emitting element 212. Similarly, this also avoids the loss in a path where the ultrasonic wave 201 is reflected by a medium on an inner side of the reflecting pad 214 and is transferred to the receiving element 213. More importantly, the middle frame 22 needs to drive the emitting element 212 and the receiving element 213 to be pushed inward when an outer side of the middle frame 22 is pressed inward, such that the reflecting pad 214 in the region deforms. Therefore, a corresponding deformation may be generated accurately and reliably upon pressing only when the reflecting pad 214 abuts the emitting element 212 and the receiving element 213 all the time, so as to avoid an error caused by a gap.

The middle frame 22 may be provided with a plurality groups of emitting elements 212 and a plurality groups of corresponding receiving elements 213. A control region that the user may press to control is formed in a position where the emitting element 212 and the receiving element 213 are disposed. The control region may be disposed on one side of the display screen of the terminal device 20, located at a position on the side close to a top end and a bottom end of the middle frame 22. When the user controls a landscape screen, the control region is located at both ends of the top of the landscape screen, which is convenient for the user to press with an index finger when holding it with two hands. In the control region, a corresponding pattern may be formed on an outer side face of the middle frame 22, for identifying a position of the control region, such that the user may accurately press the corresponding position. By pressing, the middle frame 22 in the control region deforms inward and drives the emitting element 212 and the receiving element 213 to push the reflecting pad 214 inward, such that the reflecting pad 214 deforms. The change in the medium density of the reflecting pad 214 also changes the density difference between the medium of the reflecting pad 214 and the medium on the inner side of the reflecting pad 214, such that the intensity of the reflected wave when the ultrasonic wave emitted inward by the emitting element 212 passes through the reflecting pad 214 and then enters the medium on the inner side of the reflecting pad 214 changes.

As illustrated in FIG. 6 and FIG. 7, the emitting element 212 and the receiving element 213 may be respectively affixed to FPC 215 through SMT, and on a back side, may be supported by a base layer 216 made of such as a resin material. During assembly, one side of the back of the emitting element 212 and the receiving element 213 is glued, by dispensing, to an inner side face of the middle frame 22. The inner side may abut against the emitting element 212 and the receiving element 213 through the reflecting pad 214.

In the embodiments of the present disclosure, a user may press a corresponding position to cause the middle frame 22 to deform inward to drive the emitting element 212 and the receiving element 213 to push the reflecting pad 214 inward, such that the reflecting pad 214 deforms, thereby changing the medium density of the reflecting pad 214. Since a medium of the reflecting pad 214 is different from that on the inner side of the reflecting pad 214, a density difference between the medium of the reflecting pad 214 and the medium on the inner side of the reflecting pad 214 changes correspondingly when the reflecting pad 214 changes the density of the medium, such that the intensity of the reflected wave 202 generated by the density difference is changed after the ultrasonic wave 201 emitted inward from the emitting element 212 passes through the reflecting pad 214. After receiving the reflected wave 202, the receiving element 213 may determine, according to the intensity of the reflected wave 202, whether the middle frame 22 is pressed. For example, a threshold may be preset. When the intensity of the reflected wave 202 received by the receiving element 213 exceeds or equals the threshold, the terminal device 20 may determine that the middle frame 22 is pressed and then generate a corresponding press instruction. The intensity of the reflected wave 202 exceeding the threshold may be the intensity being either below or above the threshold, which depends on the density of the medium on the inner side of the reflecting pad 214, that is, whether the density difference between the medium of the reflecting pad 214 and the medium on the inner side of the reflecting pad 214 increases or decreases before and after the reflecting pad 214 is extruded to deform. If the density difference between the medium of the reflecting pad 214 in a deformation state and the medium on the inner side of the reflecting pad 214 increases, according to the principle of reflected waves, the intensity of the reflected wave 202 increases when the reflecting pad 214 is pressed, and the threshold may be preset to be greater than the intensity of the reflected wave 202 when it is not pressed. When the intensity of the reflected wave 202 is detected to be greater than or equal to the threshold, the terminal device 20 determines that it is pressed. On the other hand, if the density difference between the medium of the reflecting pad 214 in a deformation state and the medium on the inner side of the reflecting pad 214 decreases, according to the principle of reflected waves, the intensity of the reflected wave 202 decreases when the reflecting pad 214 is pressed, and the threshold may be preset to be less than the intensity of the reflected wave 202 when it is not pressed. When the intensity of the reflected wave 202 is detected to be less than or equal to the threshold, the terminal device 20 determines that it is pressed.

The embodiments of the present disclosure adopt the reflection principle of ultrasonic waves, which is, in the process of transmission, a reflection quantity of an ultrasonic wave is positively correlated with a density difference between media. And more importantly, in the embodiments of the present disclosure, both the emitting element 212 and the receiving element 213 are disposed facing inside. By pressing and pushing, the inside reflecting pad 214 deforms, so as to change the density difference with the medium on the inner side of the reflecting pad 214 and change the intensity of the reflected wave 202. Therefore, the material and the thickness of the middle frame 22 have no effect on the sensing of the ultrasonic wave, which, compared to a configuration where the middle frame 22 has to be made of metal and the thickness needs to be less than 1.6 mm, an optional space of the middle frame 22 is added, and the properties of the middle frame 22 may be set according to an actual structure, a shape requirement, and the like. In some embodiments, the middle frame 22 may include at least one of the following materials: plastic, plastic rubber, metal, and MDA. In some other embodiments, a thickness of the middle frame 22 may be greater than or equal to 1.6 mm. With the setting in the present disclosure, the middle frame 22 may be made of diversified materials. In particular, a non-metallic middle frame 22 may meet the requirements of miniaturization and lightweight of the terminal device 20. In some cases, shielding and interference of the middle frame 22 on signals may be reduced to meet design requirements of some antennas. The thickness of the middle frame 22 is greater than or equal to 1.6 mm, for example, the thickness may be set to 2 mm or the like, so as to increase the intensity of the middle frame 22. The non-metallic middle frame 22 may also meet support and protection functions.

Figure 11:
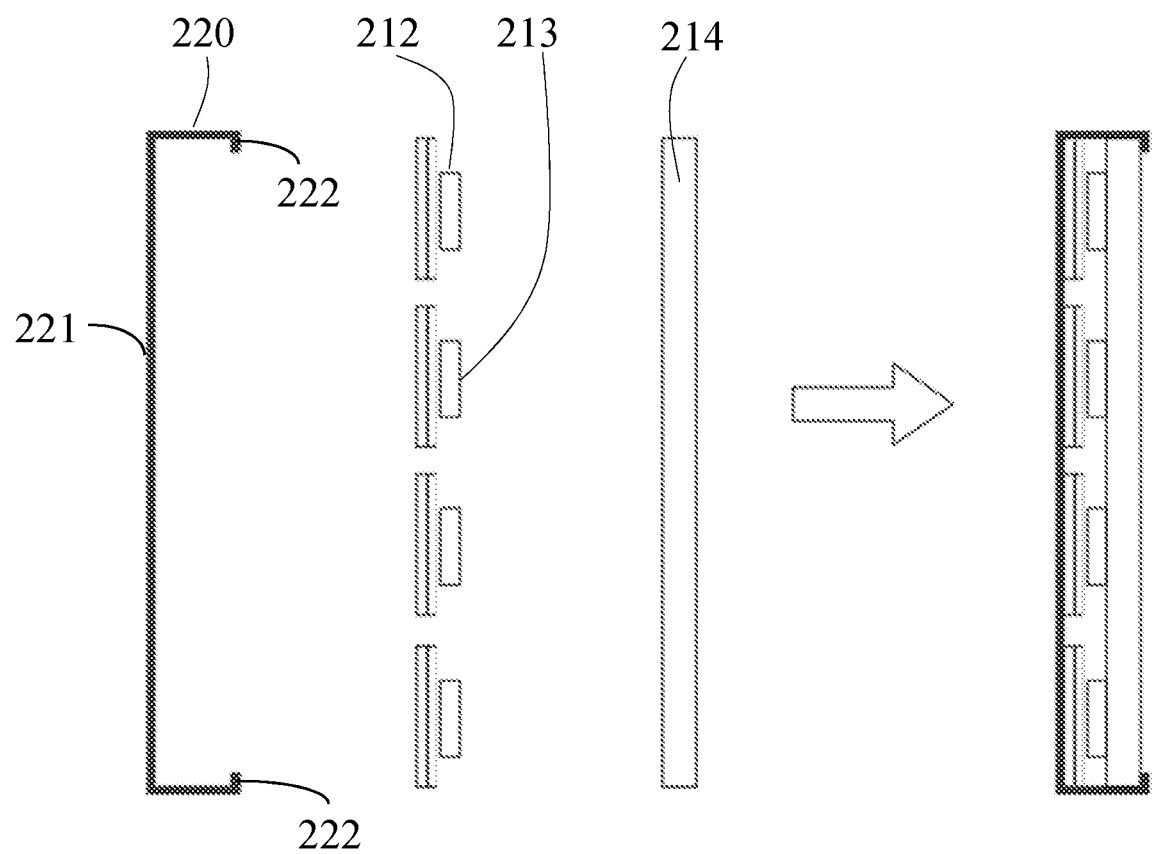
FIG. 11 is a schematic view of a fixing clamp for clamping a reflecting pad according to an embodiment of the present disclosure.

In some embodiments, as shown in FIG. 11, the press sensing assembly 21 may further include: a fixing clamp 220 with one end 221 fixedly connected to the middle frame 22 and the other ends 222 disposed on a second surface of the reflecting pad 214. The second surface of reflecting pad 214 faces away from the first surface, and is the surface not in contact with the emitting element 212 or the receiving element 213. The fixing clamp may have a certain elasticity, for clamping the reflecting pad 214 and enabling the reflecting pad 214 to closely depend on the side of the middle frame 22 and closely contact the emitting element 212 and the receiving element 213. There may be one or a plurality of fixing clamps. For example, fixing clamps are disposed on two ends of the reflecting pad 214. A middle region of the reflecting pad 214 corresponds to the emitting element 212 and the receiving element 213. Moreover, with avoidance setting of the fixing clamps on the two ends, it may also ensure that a central region of the second surface of the reflecting pad 214 has no other elements and is only in contact with the air, so as to realize two media composed of the reflecting pad 214 and the air to cause the ultrasonic wave to be reflected.

Figure 10:
FIG. 10 is a schematic flowchart of a press-sensing control method according to an exemplary embodiment of the present disclosure.

Based on the same conception, as illustrated in FIG. 10, the present disclosure further provides a press-sensing control method 30. The press-sensing control method 30 of the present disclosure may be applied to the terminal device 20 in any one of the above embodiments. The press-sensing control method 30 may include step S31 of emitting an ultrasonic wave through an emitting element, and receiving a reflected wave through a receiving element; and step S32 of generating a corresponding press instruction if the intensity of the reflected wave exceeds a threshold. The press instruction may be a control instruction corresponding to a current terminal device scenario; or may be a control instruction of a terminal device system, such as volume adjustment. For example, exceeding the threshold may be the intensity being either below or above the threshold, which depends on the density of the medium of the reflecting pad 214 and the density of the medium on the inner side of the reflecting pad 214, that is, whether the density difference between the medium of the reflecting pad 214 and the medium on the inner side of the reflecting pad 214 increases or decreases before and after the reflecting pad 214 is extruded to deform. If the density difference between the medium of the reflecting pad 214 in a deformation state and the medium on the inner side of the reflecting pad 214 increases, according to the principle of reflected waves, the intensity of the reflected wave 202 increases when the reflecting pad 214 is pressed, and the threshold may be preset to be greater than the intensity of the reflected wave 202 when it is not pressed. When the intensity of the reflected wave 202 is detected to be greater than or equal to the threshold, the terminal device 20 determines that it is pressed. On the other hand, if the density difference between the medium of the reflecting pad 214 in a deformation state and the medium on the inner side of the reflecting pad 214 decreases, according to the principle of reflected waves, the intensity of the reflected wave 202 decreases when the reflecting pad 214 is pressed, and the threshold may be preset to be less than the intensity of the reflected wave 202 when it is not pressed. When the intensity of the reflected wave 202 is detected to be less than or equal to the threshold, the terminal device 20 determines that it is pressed. With a press-sensing control method 30, control may be performed conveniently, a variety of control manners are achieved, and the control has high accuracy and reliability, thereby reducing the risk of accidental touch.

It should be understood that "a plurality of" in the present disclosure refers to two or more than two, which is similar to other quantifiers. The expression "and/or" describes the association relationship of associated objects, which means that there may be three kinds of relationships. For example, A and/or B, refers to that there are three kinds of situations, namely only A, A and B at the same time, and only B. The character "/" generally indicates that the associated objects are in an "or" relationship. The singular forms of "one", "said" and "the" are also intended to include plural forms, unless clearly indicated in the context otherwise.

It should be understood that, although terms such as first and second are used herein for describing various kinds of information in this disclosure, such information should not be limited to these terms. These terms are only used for distinguishing the same type of information from each other, and do not indicate a particular order or a degree of importance. In fact, the terms "first" and "second" may be used interchangeably. For example, without departing from the scope of this disclosure, a first information may also be called as a second information, and similarly, the second information may also be called as the first information.

It should be further understood that, terms such as "central," "longitudinal," "lateral," "front", "rear", "upper," "lower," "left," "right," "vertical," "horizontal," "top," "bottom," "inner," and "outer" indicate the orientation or position relationship based on the orientation or position relationship illustrated in the drawings, which are only intended for convenience of description or for simplifying description of the present embodiment, and do not alone indicate or imply that the device or element referred to must have a particular orientation or be constructed and operated in a specific orientation.

It should be further understood that, unless specified otherwise, the term "connected" includes a direct connection without other members, and an indirect connection via other elements therebetween.

It should be further understood that, in the embodiments of the present disclosure, the operations are described in a specific order in the drawings, which cannot be construed that these operations are required to execute in a specific or serial order as illustrated, or execute all the illustrated operations to obtain the desired results. Multitasking and parallel processing may be advantageous in a particular environment.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A press sensing assembly, comprising:
   an emitting element including a first side and a second side thereopposite and emitting an ultrasonic wave;
   a receiving element disposed adjacent to the emitting element, receiving a reflected wave of the reflected ultrasonic wave; and
   a reflecting pad disposed the first side and the receiving element and having a first surface and a second surface facing away from the first surface, and the first surface of the reflecting pad abutting the emitting element and the receiving element,
   wherein when the second side is pressed, a region of the reflecting pad corresponding to a pressed region deforms, and a medium density in a deforming region increases; or
   wherein when the receiving element is pressed, a region of the reflecting pad corresponding to a pressed region deforms, and a medium density in a deforming region increases; or
   wherein when the second side and the receiving element are pressed, a region of the reflecting pad corresponding to a pressed region deforms, and a medium density in a deforming region increases;
   wherein the press sensing assembly further comprises a fixing clamp disposed on the second surface of the reflecting pad, the fixing clamp has elasticity for clamping the reflecting pad.

2. The press sensing assembly according to claim 1, wherein the medium density of the reflecting pad is between 1 kg/m$^3$ and 1.5 kg/m$^3$.

3. The press sensing assembly according to claim 2, wherein the reflecting pad is made of rubber.

4. The press sensing assembly according to claim 2, wherein the medium on an inner side of the reflecting pad is air.

5. The press sensing assembly according to claim 1, wherein the press sensing assembly comprises:
   a support plate disposed on a second surface of the reflecting pad, covering at least a region corresponding to the emitting element and the receiving element, a medium density of the support plate being different from a medium density of the reflecting pad, wherein the second surface faces away from the first surface.

6. The press sensing assembly according to claim 5, wherein the support plate is rigid, and the medium density of the support plate is greater than or equal to 1000 kg/m$^3$.

7. The press sensing assembly according to claim 5, wherein the support plate is made of a metal material.

8. The press sensing assembly according to claim 1, wherein the emitting element and the receiving element are disposed adjacent to each other.

9. The press sensing assembly according to claim 1, wherein two sides of one emitting element each are provided with one receiving element.

10. The press sensing assembly according to claim 1, wherein two sides of one receiving element each are provided with one emitting element.

11. The press sensing assembly according to claim 1, wherein a plurality of emitting elements and a plurality of receiving elements are provided, and the emitting elements and the receiving elements are arranged alternately in a row or in a matrix array.

12. The press sensing assembly according to claim 1, wherein the emitting element and the receiving element are an emitter and a receiver made of piezoelectric ceramic materials.

13. A terminal device, comprising:
   a display screen; and
   a press sensing assembly comprising:
   an emitting element emitting including a first side and a second side thereopposite and an ultrasonic wave;
   a receiving element disposed adjacent to the emitting element, receiving a reflected wave of the reflected ultrasonic wave; and
   a reflecting pad disposed the first side and the receiving element and having a first surface and a second surface facing away from the first surface, and the first surface of the reflecting pad abutting the emitting element and the receiving element,
   wherein when the second side is pressed, a region of the reflecting pad corresponding to a pressed region deforms, and a medium density in a deforming region increases; or
   wherein when the receiving element is pressed, a region of the reflecting pad corresponding to a pressed region deforms, and the medium density in a deforming region increases; or
   wherein when the second side and the receiving element are pressed, a region of the reflecting pad corresponding to a pressed region deforms, and a medium density in a deforming region increases;
   wherein the press sensing assembly further comprises a fixing clamp disposed on the second surface of the reflecting pad, the fixing clamp has elasticity for clamping the reflecting pad.

14. The terminal device according to claim 13, comprising:
   a middle frame;
   a back side of the emitting element being disposed on an inner side face of the middle frame;
   a back side of the receiving element being disposed on the inner side face of the middle frame; and
   a reflecting pad disposed on an inner side of the emitting element and the receiving element, and a first surface of the reflecting pad abutting the emitting element and the receiving element,
   wherein when an outer side face of the middle frame is pressed, a region of the reflecting pad corresponding to the pressed region deforms and the medium density in the deforming region increases.

15. The terminal device according to claim 14, wherein the middle frame is a frame body for forming an outer side wall of the terminal device.

16. The terminal device according to claim 14, wherein the middle frame is provided with a plurality groups of emitting elements and a plurality groups of corresponding receiving elements.

17. The terminal device according to claim 14, wherein the emitting element and the receiving element are respectively affixed to a Flexible Printed Circuit through a Surface Mounted Technology, and on a back side, is supported by a base layer.

18. The terminal device according to claim 17, wherein the base layer is made of a resin material.

19. The terminal device according to claim 14, wherein the middle frame comprises at least one of the following materials: plastic, plastic rubber, metal, and malondialdehyde.

20. The terminal device according to claim 14, wherein a thickness of the middle frame is greater than or equal to 1.6 mm.

\* \* \* \* \*